United States Patent
Lee et al.

(10) Patent No.: US 9,859,380 B2
(45) Date of Patent: Jan. 2, 2018

(54) FINFETS WITH STRAINED WELL REGIONS

(71) Applicant: Taiwan Semiconductor Manufacturing Company, Ltd., Hsinchu (TW)

(72) Inventors: Yi-Jing Lee, Hsinchu (TW); Chi-Wen Liu, Hsinchu (TW); Cheng-Hsien Wu, Hsinchu (TW); Chih-Hsin Ko, Fongshan (TW); Clement Hsingjen Wann, Carmel, NY (US)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/450,201

(22) Filed: Mar. 6, 2017

(65) Prior Publication Data
US 2017/0179291 A1    Jun. 22, 2017

Related U.S. Application Data (60) Continuation of application No. 14/846,020, filed on Sep. 4, 2015, now Pat. No. 9,601,342, which is a
(Continued)

(51) Int. Cl.
*H01L 29/161* (2006.01)
*H01L 29/78* (2006.01)
(Continued)

(52) U.S. Cl.
CPC ...... *H01L 29/161* (2013.01); *H01L 21/02532* (2013.01); *H01L 21/31055* (2013.01);
(Continued)

(58) Field of Classification Search
CPC .......................... H01L 29/161; H01L 29/165
See application file for complete search history.

(56) References Cited

U.S. PATENT DOCUMENTS

| 5,565,375 A | 10/1996 | Hiser et al. |
| 7,154,118 B2 | 12/2006 | Lindert et al. |

(Continued)

FOREIGN PATENT DOCUMENTS

| CN | 101189730 A | 5/2008 |
| DE | 102010038742 A1 | 2/2012 |

(Continued)

OTHER PUBLICATIONS

Daembkes, Heinrich, et al., "The n-Channel SiGe/Si Modulation-Doped Field-Effect Transistor," IEEE Transactions on Electron Devices, vol. ED-33, No. 5, May 1986, pp. 633-638.
(Continued)

*Primary Examiner* — Fei Fei Yeung Lopez
(74) *Attorney, Agent, or Firm* — Slater Matsil, LLP (57) ABSTRACT

A device includes a substrate and insulation regions over a portion of the substrate. A first semiconductor region is between the insulation regions and having a first conduction band. A second semiconductor region is over and adjoining the first semiconductor region, wherein the second semiconductor region includes an upper portion higher than top surfaces of the insulation regions to form a semiconductor fin. The second semiconductor region also includes a wide portion and a narrow portion over the wide portion, wherein the narrow portion is narrower than the wide portion. The semiconductor fin has a tensile strain and has a second conduction band lower than the first conduction band. A third semiconductor region is over and adjoining a top surface and sidewalls of the semiconductor fin, wherein the third semiconductor region has a third conduction band higher than the second conduction band.

20 Claims, 7 Drawing Sheets

Related U.S. Application Data division of application No. 13/789,798, filed on Mar. 8, 2013, now Pat. No. 9,159,824.

(51) Int. Cl.

| | | |
|---|---|---|
| *H01L 29/06* | (2006.01) | |
| *H01L 29/08* | (2006.01) | |
| *H01L 29/10* | (2006.01) | |
| *H01L 29/165* | (2006.01) | |
| *H01L 21/8234* | (2006.01) | |
| *H01L 21/762* | (2006.01) | |
| *H01L 21/3105* | (2006.01) | |
| *H01L 21/02* | (2006.01) | |
| *H01L 29/778* | (2006.01) | |
| *H01L 29/66* | (2006.01) | |

(52) U.S. Cl.
CPC ......... *H01L 21/76224* (2013.01); *H01L 21/823412* (2013.01); *H01L 21/823431* (2013.01); *H01L 21/823481* (2013.01); *H01L 29/0649* (2013.01); *H01L 29/0847* (2013.01); *H01L 29/1095* (2013.01); *H01L 29/165* (2013.01); *H01L 29/66431* (2013.01); *H01L 29/778* (2013.01); *H01L 29/7842* (2013.01); *H01L 29/7851* (2013.01)

(56) References Cited

U.S. PATENT DOCUMENTS

| | | |
|---|---|---|
| 2003/0001171 A1 | 1/2003 | Banno et al. |
| 2003/0178677 A1 | 9/2003 | Clark et al. |
| 2003/0230778 A1 | 12/2003 | Park et al. |
| 2004/0256647 A1 | 12/2004 | Lee et al. |
| 2005/0184316 A1 | 8/2005 | Kim et al. |
| 2006/0076625 A1 | 4/2006 | Lee et al. |
| 2010/0163926 A1 | 7/2010 | Hudait et al. |
| 2010/0230658 A1 | 9/2010 | Pillarisetty et al. |
| 2010/0252816 A1 | 10/2010 | Ko et al. |
| 2011/0147711 A1 | 6/2011 | Pillarisetty et al. |
| 2011/0156006 A1 | 6/2011 | Chui et al. |
| 2012/0025312 A1 | 2/2012 | Scheiper et al. |
| 2012/0074386 A1 | 3/2012 | Rachmady et al. |
| 2012/0091528 A1 | 4/2012 | Chang et al. |
| 2012/0319211 A1 | 12/2012 | van Dal et al. |
| 2013/0001591 A1 | 1/2013 | Wu et al. |
| 2013/0056795 A1 | 3/2013 | Wu et al. |
| 2013/0270638 A1 | 10/2013 | Adam et al. |
| 2013/0341638 A1* | 12/2013 | Liao ............... H01L 29/66484 257/77 |
| 2014/0054547 A1 | 2/2014 | Eneman et al. |
| 2014/0239402 A1 | 8/2014 | Lee et al. |
| 2015/0054040 A1 | 2/2015 | Lee et al. |

FOREIGN PATENT DOCUMENTS

| | | |
|---|---|---|
| KR | 1020050078145 A | 8/2005 |
| KR | 101145959 B1 | 10/2010 |
| KR | 20100111241 A | 10/2010 |
| KR | 1020110052432 A | 5/2011 |
| WO | 2007046150 A1 | 4/2007 |

OTHER PUBLICATIONS

Pillarisetty, R., et al., "High Mobility Strained Germanium Quantum Well Field Effect Transistor as the P-Channel Device Option for Low Power (Vcc=0.5V) III-V CMOS Architecture," IEEE, IEDM10-159, pp. 6.7.1-6.7.4., Dec. 6-8, 2010.

* cited by examiner

FINFETS WITH STRAINED WELL REGIONS

CROSS-REFERENCE TO RELATED APPLICATION

This application is continuation of U.S. patent application Ser. No. 14/846,020, entitled "FinFETs with Strained Well Regions," filed Sep. 4, 2015, which is a divisional of U.S. patent application Ser. No. 13/789,798, entitled "FinFETs with Strained Well Regions," filed Mar. 8, 2013, now U.S. Pat. 9,159,824 issued Oct. 13, 2015, which application relates the following commonly-assigned U.S. patent application Ser. No. 13/779,015, filed Feb. 27, 2013, and entitled "FinFETs with Strained Well Regions," which applications are hereby incorporated herein by reference.

BACKGROUND

The speed of metal-oxide-semiconductor (MOS) transistors are closely related to the drive currents of the MOS transistors, which are further closely related to the mobility of charges in the channels of the MOS transistors. For example, NMOS transistors have high drive currents when the electron mobility in their channel regions is high, while PMOS transistors have high drive currents when the hole mobility in their channel regions is high. Germanium, silicon germanium, and compound semiconductor materials (referred to as III-V compound semiconductors hereinafter) comprising group III and group V elements are thus good candidates for forming their high electron mobility and/or hole mobility.

Germanium, silicon germanium, and III-V compound semiconductor regions are also promising materials for forming the channel regions of Fin Field-Effect transistors (FinFETs). Methods and structures for further improving the drive currents on the FinFETs are currently being studied.

BRIEF DESCRIPTION OF THE DRAWINGS

For a more complete understanding of the embodiments, and the advantages thereof, reference is now made to the following descriptions taken in conjunction with the accompanying drawings, in which:

FIGS. 1 through 10C are cross-sectional views of intermediate stages in the manufacturing of a semiconductor fin and a Fin Field-Effect Transistor (FinFET) in accordance with some exemplary embodiments.

DETAILED DESCRIPTION OF ILLUSTRATIVE EMBODIMENTS

The making and using of the embodiments of the disclosure are discussed in detail below. It should be appreciated, however, that the embodiments provide many applicable concepts that can be embodied in a wide variety of specific contexts. The specific embodiments discussed are illustrative, and do not limit the scope of the disclosure.

Fin Field-Effect Transistors (FinFETs) and methods of forming the same are provided in accordance with various exemplary embodiments. The intermediate stages of forming the FinFETs in accordance with some embodiments are illustrated. The variations of the embodiments are discussed. Throughout the various views and illustrative embodiments, like reference numbers are used to designate like elements.

Figure 1:
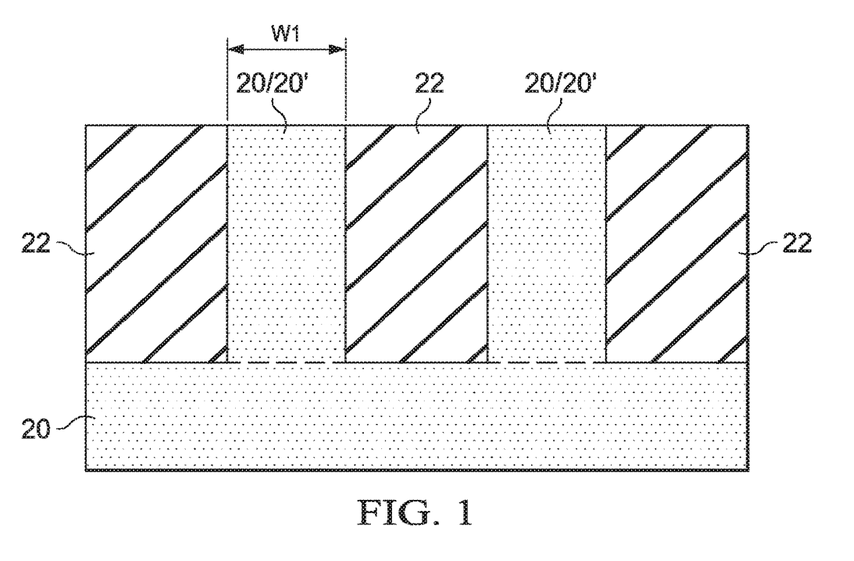

Referring to FIG. 1, substrate 20 is provided. Substrate 20 may be a semiconductor substrate such as a crystalline silicon substrate. Substrate 20 may also include silicon, germanium, carbon, or the like. Insulation regions such as Shallow Trench Isolation (STI) regions 22 are formed in substrate 20. STI regions 22 may be formed by recessing semiconductor substrate 20 to form trenches, and then filling the trenches with dielectric materials such as silicon oxide. A Chemical Mechanical Polish (CMP) is then performed to remove excess portions of the dielectric materials, and the remaining portions are STI regions 22. The top surfaces of STI regions 22 are thus level with the top surface of substrate 20.

STI regions 22 include neighboring regions having their sidewalls facing each other. Portions 20' of substrate 20 extend between the neighboring STI regions. Width W1 of substrate portions 20' may be between about 10 nm and about 200 nm. It is appreciated that the dimensions recited throughout the description are merely examples, and may be changed to different values. The neighboring STI regions may be separate regions, or may be portions of a continuous region, which may form a STI ring in some embodiments.

Figure 2:
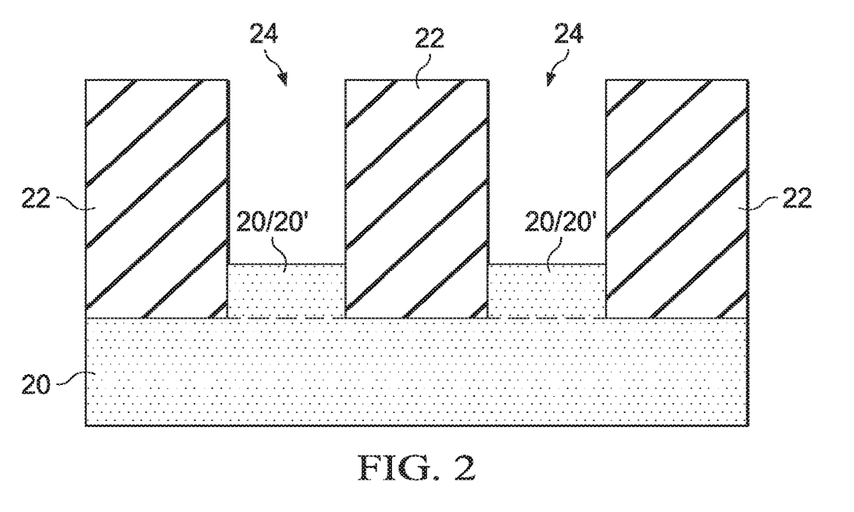

Referring to FIG. 2, substrate portions 20' are recessed, forming recesses 24 between neighboring STI regions 22. In some embodiments, the bottoms of recesses 24 are higher than the bottom surfaces of STI regions 22. In alternative embodiments, the bottoms of recesses 24 are substantially level with or lower than the bottoms of STI regions 22.

Figure 3:
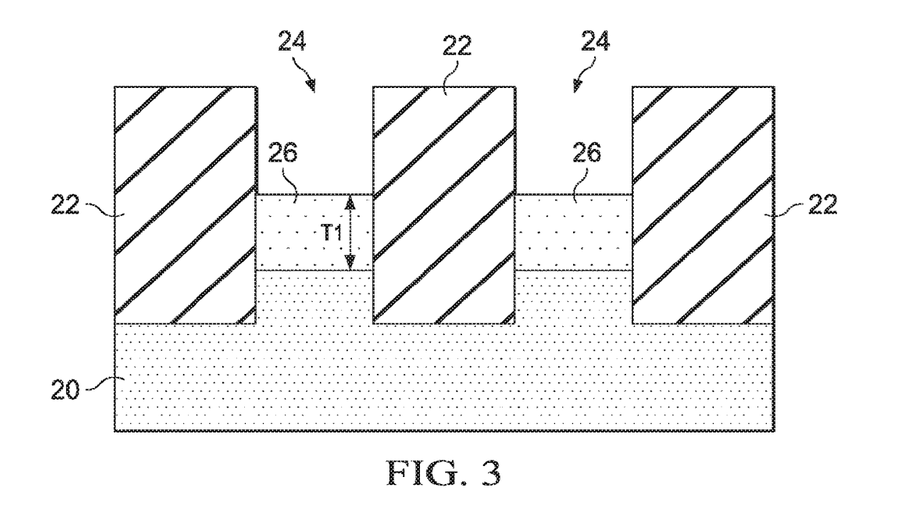
Figure 11:
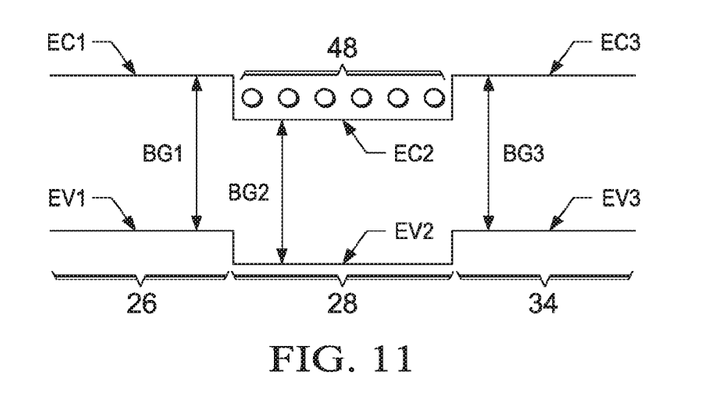
FIG. 11 illustrates a band diagram of a plurality of semiconductor regions in the FinFET.

Referring to FIG. 3, semiconductor regions 26 are grown in recesses 24 through epitaxy. The top surfaces of semiconductor regions are lower than the top surfaces of STI regions 22. Semiconductor regions 26 may have a first lattice constant greater than the lattice constant of substrate 20. In some embodiments, semiconductor regions 26 comprises silicon germanium, which is expressed as $Si_{1-x}Ge_x$, wherein value X is the atomic percentage of germanium in semiconductor regions 26, which atomic percentage may be between about 0.2 (20 percent) and 1 (100 percent) in exemplary embodiments. Semiconductor regions 26 are a relaxed semiconductor region, which means that at least the top portions of semiconductor regions are relaxed with substantially no stress. This may be achieved by, for example, making thickness T1 great enough, since the stresses in upper portions of semiconductor regions 26 are increasingly smaller than the lower portions. In some exemplary embodiments, thickness T1 is greater than about 30 nm, and may be between about 30 nm and about 150 nm. In some exemplary embodiments, the conduction band of semiconductor regions 26 is lower than the conduction band of bulk silicon by between about 0.036 eV and about 0.144 eV, wherein the conduction band of silicon is about 1.1 eV. FIG. 11 schematically illustrates bandgap BG1, conduction band Ec1, and valence band Ev1 of semiconductor regions 26.

Figure 4:
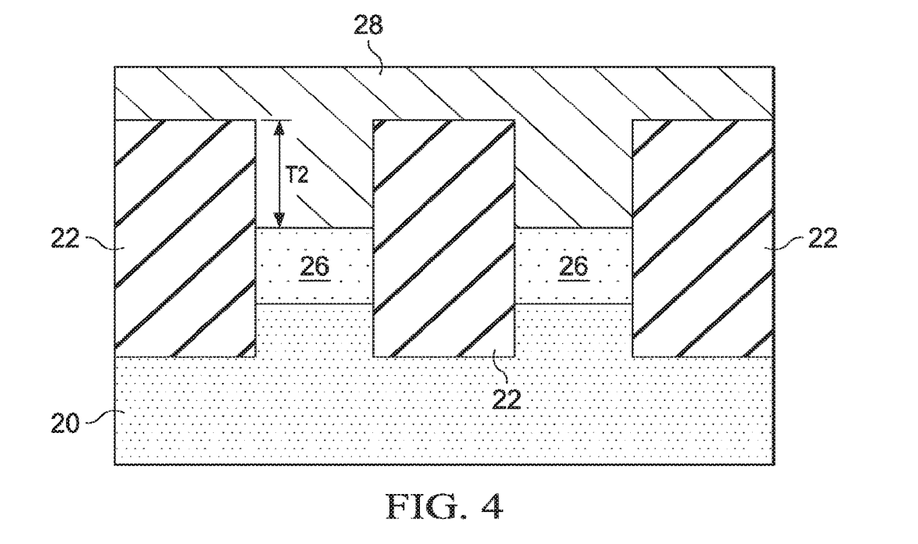

Next, referring to FIG. 4, semiconductor regions 28 are grown in recesses 24 through epitaxy, wherein semiconductor regions 28 are grown over and contacting semiconductor regions 26. Semiconductor regions 28 have a tensile strain, and may be un-doped with n-type and p-type impurities. In some embodiments, the tensile strain is generated by making the lattice constant of semiconductor regions 28 smaller than the lattice constant of semiconductor regions 26. In some embodiments, the tensile strain is higher than about 1.36 MPa, and may be higher than about 6.8 GPa. Semiconductor regions 28 include portions in recesses 24 (FIG. 3), which portions have thickness T2. Thickness T2 is small enough, so that after the subsequent Chemical Mechanical Polish (CMP) in FIG. 5, semiconductor regions 28 are not relaxed and have the tensile strain. In some exemplary embodiments, thickness T2 is smaller than about 150 nm, and may be between about 30 nm and about 150 nm.

FIG. 11 schematically illustrates bandgap BG2, conduction band Ec2, and valence band Ev2 of semiconductor regions 28. Conduction band Ec2 is lower than the conduction band Ec1 of semiconductor regions 26, with the difference (Ec1−Ec2) being greater than about 0.036 eV, for example. In some embodiments, semiconductor regions 28 comprise $Si_{1-y}Ge_y$, wherein value Y is the atomic percentage of germanium in semiconductor regions 28. Value Y may be smaller than about 0.3 (30 percent), and may be between 0 and about 0.3. Value Y may also be equal to 0, which means that semiconductor regions 28 are silicon regions free from germanium. Furthermore, value Y is smaller than value X of semiconductor regions 26, with the difference (X−Y) being greater than about 0.1, greater than about 0.3, or greater than about 0.5, for example. A greater difference (X−Y) may advantageously result in a greater tensile strain in semiconductor regions 28, and a greater conduction band difference (Ec1−Ec2).

Figure 5:
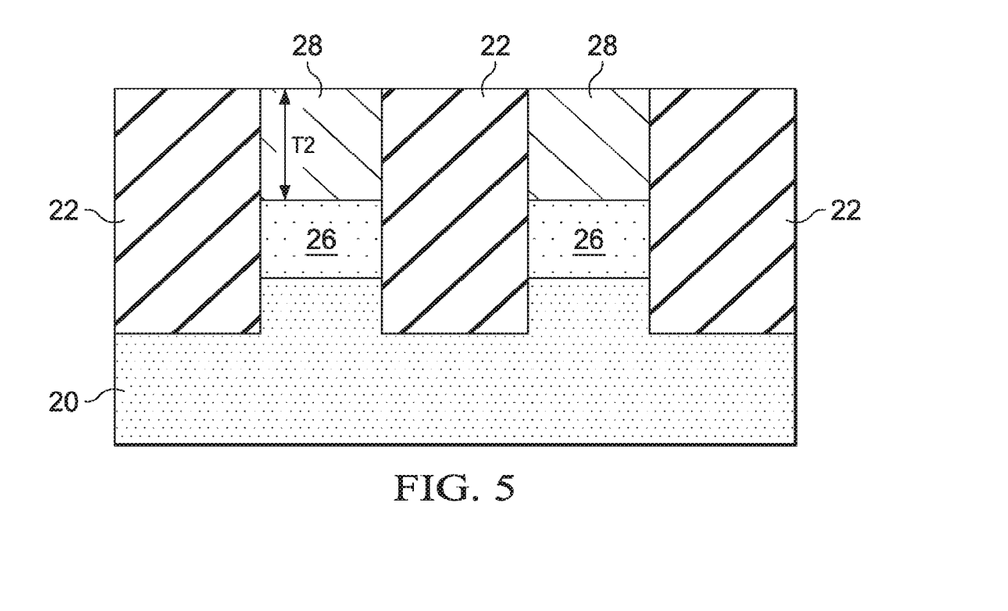

Semiconductor regions 28 may be grown to a level higher than the top surfaces of STI regions 22. A CMP is then performed to level the top surface of STI regions 22 and semiconductor regions 28. The resulting structure is shown in FIG. 5. In alternative embodiments, the growth of semiconductor regions 28 stops at a time when the top surface of semiconductor regions 28 is level with or lower than the top surfaces of STI regions 22. In these embodiments, the CMP may be performed, or may be skipped.

Figure 6:
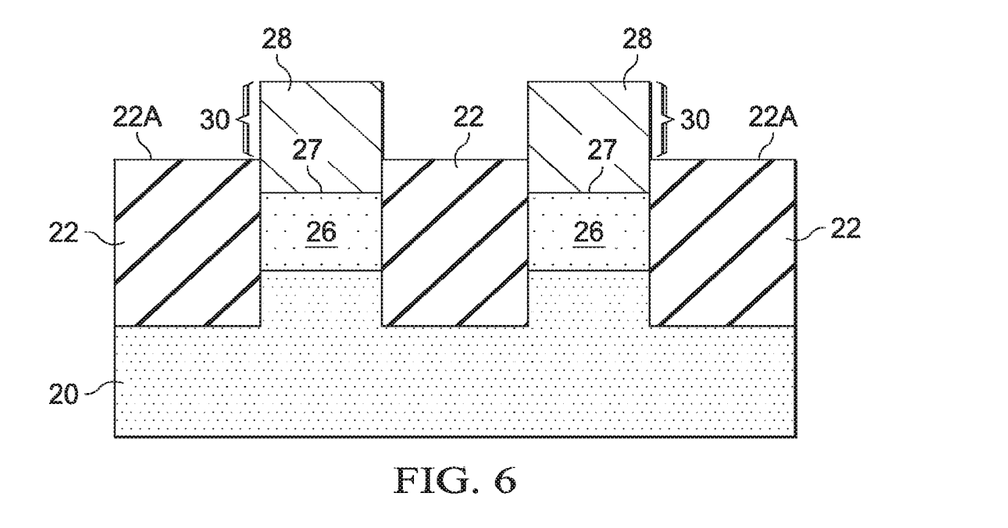

Referring to FIG. 6, STI regions 22 are recessed, for example, through an etching step. The top surfaces 22A of the remaining STI regions 22 are higher than the interfaces 27 between semiconductor regions 26 and semiconductor regions 28. The portions of semiconductor regions 28 that are higher than top surfaces 22A are referred to as semiconductor fins 30 hereinafter.

Figure 7:
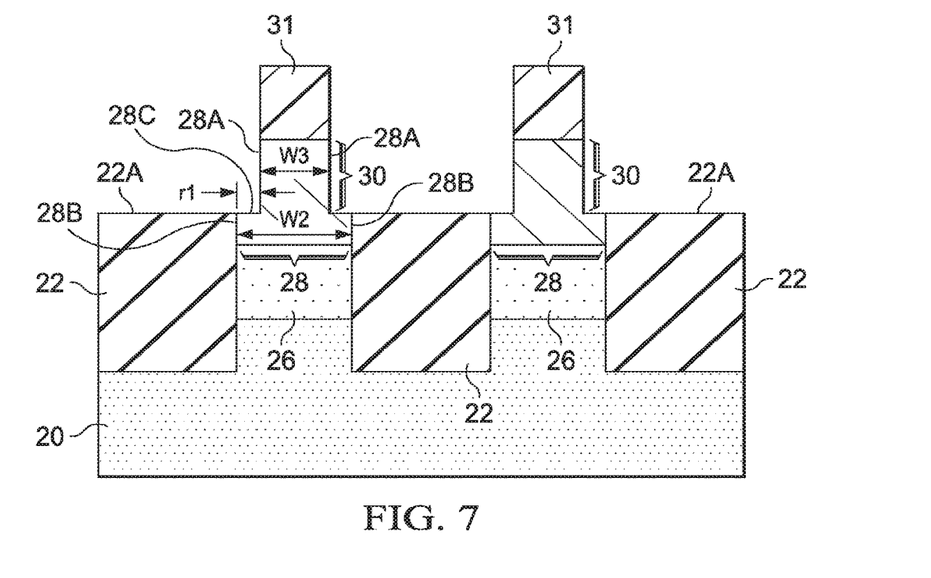

FIG. 7 illustrates the thinning of semiconductor regions 28. In some embodiments, the thinning is performed by applying and patterning photo resist 31, and then using photo resist 31 as a mask to etch semiconductor fins 30. As a result of the thinning, semiconductor regions 28 have lower portions and upper portions narrower than the lower portions. The lower portions have width W2, and the upper portions have width W3, wherein both widths W2 and W3 are measured close to the transition region transiting from the narrow portions to the wide portions. In some embodiments, width W2 is between about 8 nm and about 200 nm, and width W3 is between about 6 nm and about 200 nm. The difference (W2−W3) may be greater than about 2 nm, or greater than about 5 nm, for example. In some exemplary embodiments, an entirety of semiconductor fins 30 is thinned. In alternative embodiments, an upper portion of each of semiconductor fins 30 is thinned, and the lower portion of each of semiconductor fins 30 remains not thinned.

Due to the thinning, the narrow portions of semiconductor regions 28 have sidewalls 28A, and the wide portions of semiconductor regions 28 have sidewalls 28B, which are vertically misaligned to the respective overlying sidewalls 28A. Furthermore, sidewalls 28B are not continuously transitioned to the respective overlying sidewalls 28A. Rather, top surfaces 28C of the wide portions connect sidewalls 28B to the respective overlying sidewalls 28A. Top surface 28C may be substantially flat in some embodiments. Sidewalls 28B and the respective overlying sidewalls 28A may be misaligned by misalignment r1, which may be greater than about 1 nm, or greater than about 5 nm. Top surfaces 28C may be level with the top surface 22A of STI regions 22. Alternatively, although not shown, top surfaces 28C are higher than the top surface 22A of STI regions 22.

Figure 8:
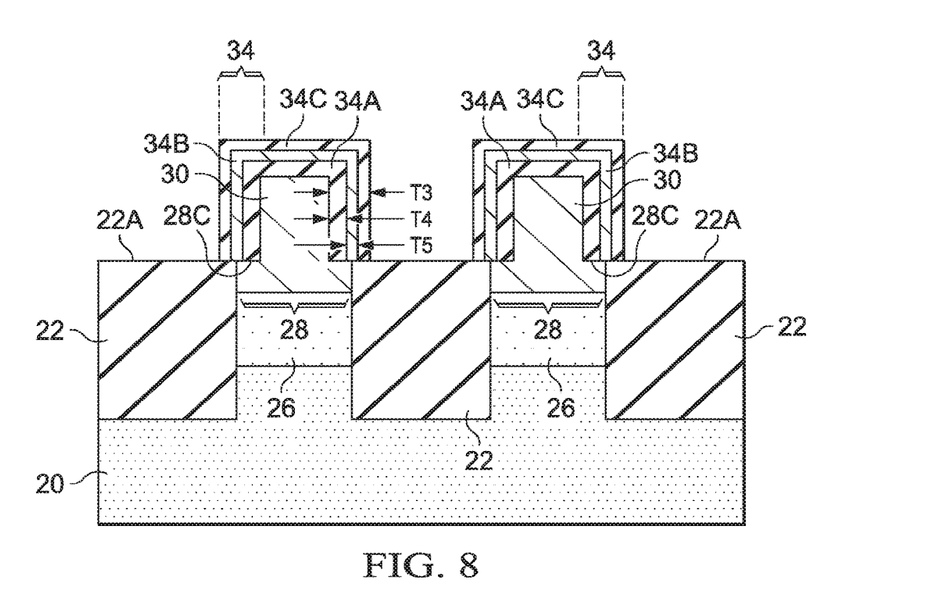

FIG. 8 illustrates the formation of semiconductor regions 34, which are epitaxially grown on the exposed top surfaces and sidewalls of semiconductor fins 30. Semiconductor regions 34 are substantially conformal layers, with the portions on the top surfaces of semiconductor fins 30 having substantially the same thickness T3 as the portions on the sidewalls of semiconductor fins 30. In some embodiments, thickness T3 is between about 5 nm and about 150 nm. Semiconductor regions 34 are in contact with the top surfaces and the sidewalls of the narrow portions of semiconductor regions 28, and in contact with the top surfaces 28C of the wide portions of semiconductor regions 28. In the embodiments that top surfaces 28C are higher than top surfaces 22A of STI regions 22, semiconductor regions 34 are also grown on the sidewalls of the wide portions of semiconductor regions 28.

Bandgap BG3, conduction band Ec3, and valence band Ev3 of semiconductor regions 34 are schematically illustrated in FIG. 11. Conduction band Ec3 is higher than conduction band Ec2 of semiconductor regions 28, with the difference (Ec3−Ec2) being greater than about 0.036 eV, for example. In some embodiments, semiconductor regions 34 comprise $Si_{1-z}Ge_z$, wherein value Z is the atomic percentage of silicon in semiconductor regions 34. Value Z may be greater than about 0.3, and maybe between about 0.3 and 1. Value Z may also be equal to 1, which means that semiconductor regions 34 are pure germanium regions free from silicon. Furthermore, value Z is greater than value Y of semiconductor regions 28, with the difference (Z−Y) being greater than about 0.1, or greater than about 0.3, for example. A greater difference (Z−Y) may advantageously result in a greater conduction band difference (Ec3−Ec2).

Figure 10A:
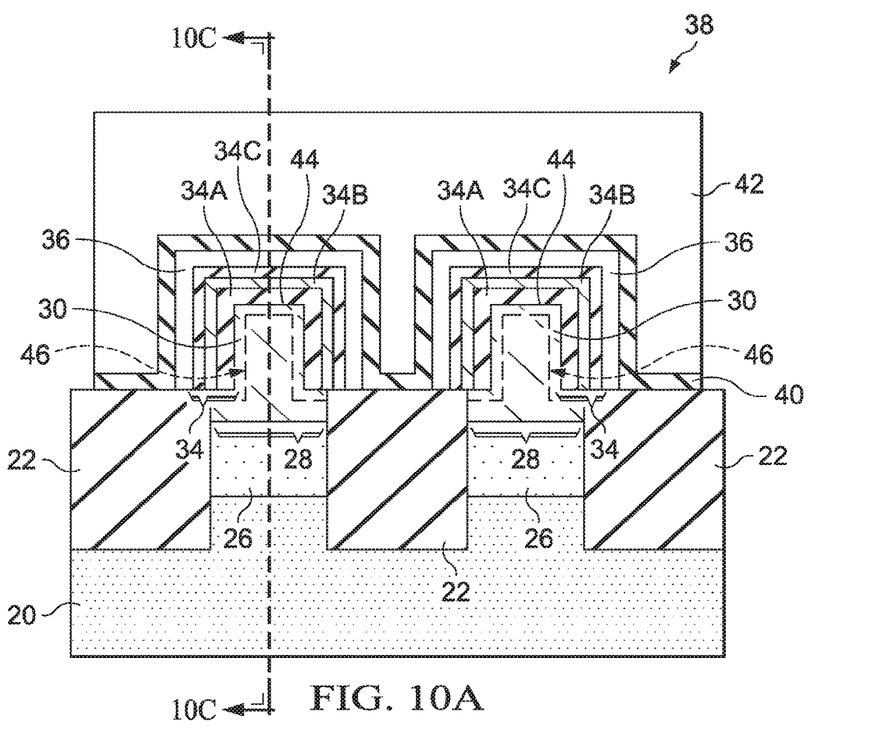
Figure 10B:
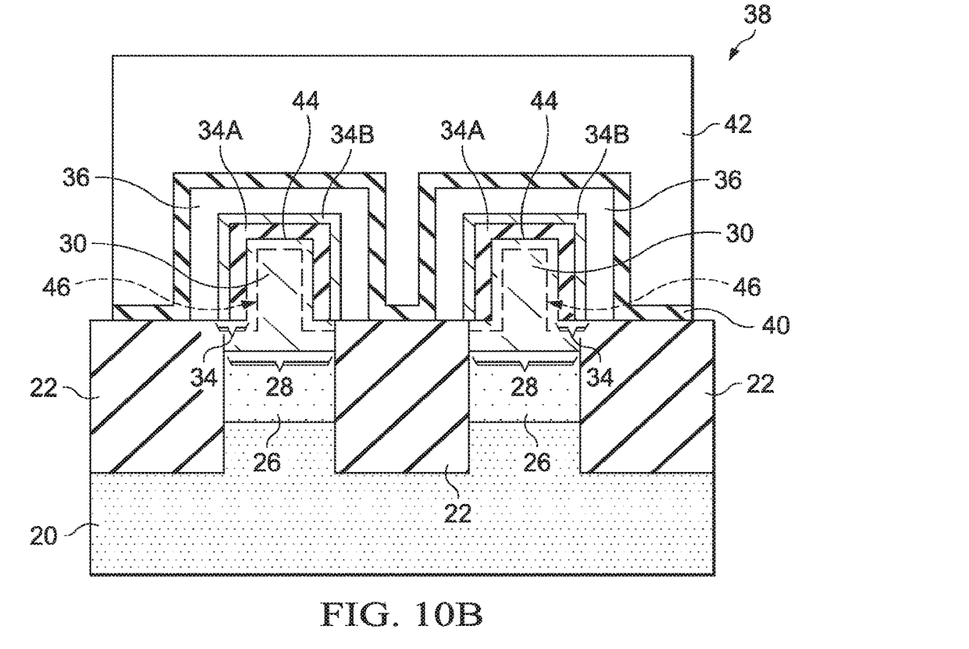
Figure 10C:
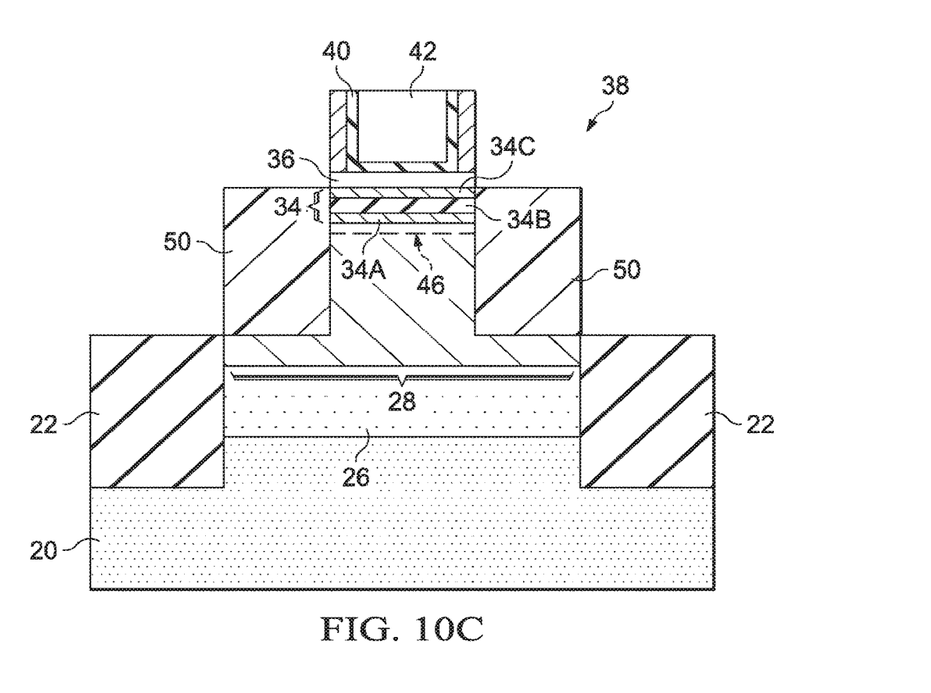

In some embodiments, semiconductor regions 34 include layers 34A and layers 34B, which are formed over layers 34A. Layers 34A and layers 34B may have substantially the same atomic percentage of silicon and substantially the same atomic percentage of germanium, although their compositions may also be different from each other. In some exemplary embodiments, layers 34A are not doped with n-type impurities, and may also be free from p-type impurities. In alternative embodiments, layers 34A are n-type doped layers with the n-type impurity concentration lower than about $10^{16}/cm^3$, for example. Thickness T4 of layers 34A may be greater than 0 nm and smaller than about 50 nm. Layers 34B are n-type layers, wherein the n-type impurity concentration in layers 34B may be higher than about $10^{18}/cm^3$. In these embodiments, the n-type impurity concentration in layers 34A is lower than the n-type impurity concentration in layers 34B. Layers 34B act as the electron-supply layers for supplying electrons to the underlying carrier channels 46 (FIG. 10A through 10C).

The doped n-type impurity may include phosphorous, arsenic, antimony, or combinations thereof. Layers 34A and layers 34B may be formed in-situ in a same vacuum chamber, and may be formed using essentially the same process conditions, except that in the formation of layers 34A, no n-type dopant is added, while the n-type dopant is added in the formation of layers 34B. Alternatively, in the formation of both layers 34A and 34B, n-type dopants are added, and the n-type dopant amount for forming layers 34A is smaller than that for forming layers 34B. In some embodiments, thickness T5 of doped layers 34B is between about 1 nm and about 20 nm.

In some embodiments, semiconductor regions 34 further include layers 34C over layers 34B. Layers 34C may have atomic percentages of silicon and germanium same as either one, or both, of layers 34A and 34B. In alternative embodiments, the silicon and germanium atomic percentages in layers 34A, 34B, and 34C are all different from each other. Layers 34C may also be un-doped with n-type impurities, or doped with n-type impurities that have a lower impurity concentration than the respective underlying layers 34B. In alternative embodiments, layers 34C are not formed, and the respective structure may be found in FIG. 10B.

Figure 9:
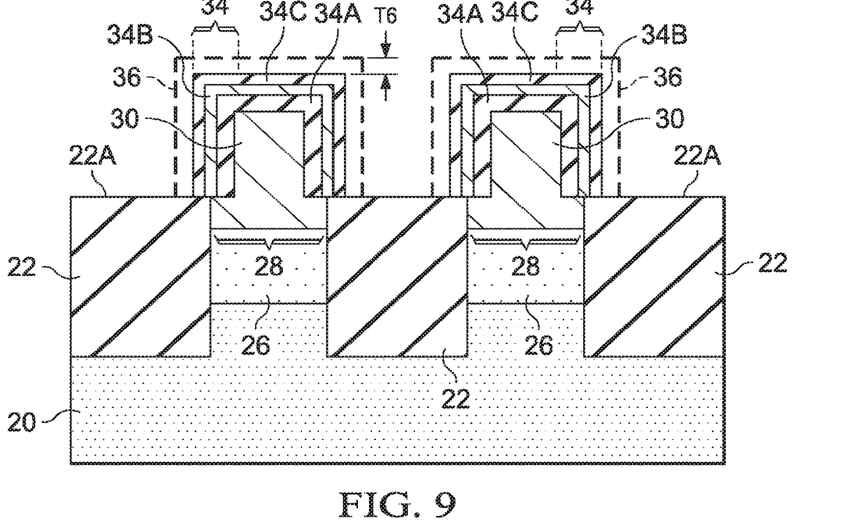

FIG. 9 illustrates the formation of silicon caps 36, which may be substantially pure silicon regions with no germanium added. Silicon caps 36 may also be formed through epitaxy, and hence are over the top portions and sidewall portions of semiconductor regions 34. In some embodiments, no n-type and p-type impurities are added into silicon caps 36, although n-type and p-type impurities with low concentrations, for example, lower than about $10^{16}/cm^3$, may also be added. Thickness T6 of silicon caps 36 may be between about 1 nm and about 20 nm in some embodiments. In alternative embodiments, silicon caps 36 are not formed.

The structure shown in FIG. 9 may be used to form FinFET 38, as shown in FIGS. 10A, 10B, and 10C. Referring to FIG. 10A, gate dielectric 40 and gate electrode 42 are formed. Gate dielectric 40 may be formed of a dielectric material such as silicon oxide, silicon nitride, an oxynitride, multi-layers thereof, and/or combinations thereof. Gate dielectric 40 may also be formed of high-k dielectric materials. The exemplary high-k materials may have k values greater than about 4.0, or greater than about 7.0. Gate electrode 42 may be formed of doped polysilicon, metals, metal nitrides, metal silicides, and the like. The bottom ends of gate dielectric 42 may contact the top surfaces of STI regions 22. After the formation of gate dielectric 40 and gate electrode 42, source and drain regions 50 (FIG. 10C) are formed.

As shown in FIG. 10A, semiconductor regions 28 form interfaces 44 with the adjoin semiconductor regions 34. Carrier channels 46, which are alternatively referred to as Two-Dimensional Electron Gas (2DEG) channels, are formed and located in semiconductor regions 28. 2DEG channels 46 may also be close to interfaces 44. Although semiconductor regions 28 may not be doped with n-type impurities, carrier channels 46 still have a high density of electrons, which are supplied by the respective overlying electron-supply layers 34B.

FIG. 10B illustrates a cross-sectional view of FinFET 38 in accordance with alternative embodiments. These embodiments are essentially the same as the embodiments in FIG. 10A, except that the layer 34C in FIG. 10A is not formed. Accordingly, silicon caps 36 are in physical contact with the respective underlying layers 34B.

FIG. 10C illustrates a cross-sectional view of FinFET 38, wherein the cross-sectional view is obtained from the plane crossing line 10C-10C in FIG. 10A. Source and drain regions 50 are formed on the opposite sides of gate dielectric 40 and gate electrode 42. Source and drain regions 50 are doped with an n-type impurity such as phosphorous, arsenic, antimony, or the like, and hence the respective FinFET 38 is an n-type FinFET. 2DEG channel 46 interconnects the source and drain regions 50.

FIG. 11 schematically illustrates a band diagram of semiconductor regions 26, 28, and 34. As shown in FIG. 11, the conduction band Ec2 of semiconductor region 28 is lower than conduction band Ec1 of semiconductor region 26 and conduction band Ec3 of semiconductor region 34. Accordingly, conduction bands Ec1, Ec2, and Ec3 form a well, with conduction band Ec2 forming the bottom of the well. Electrons 48, which are supplied by electron-supply layers 34B (FIGS. 10A and 10B), are confined in the well to form the 2DEG channels. The formation of the well is attributed to that semiconductor region 28 is tensile strained, and hence conduction band Ec2 is suppressed to a level lower than conduction bands Ec1 and Ec3. As a comparison, if semiconductor region 28 is not tensile strained, the conduction band of semiconductor region 28 will be higher than the conduction bands of semiconductor regions 26 and 34, and hence the well region and the 2DEG channel will not be formed. In addition, since semiconductor region 28 may not be doped with impurities, electrons can move freely without collision or with substantially reduced collisions with the impurities.

In the embodiments of the present disclosure, by forming relaxed semiconductor region 26 that has a greater lattice constant than the lattice constant of semiconductor region 28, the overlying semiconductor region 28 may have a tensile strain. The tensile strain results in a conduction band well to be formed in semiconductor region 28. Furthermore, electron-supply layer 34B is formed overlying semiconductor region 28 to supply electrons, which are confined in the well formed in semiconductor region 28 to form the 2DEG channel. Accordingly, the resulting FinFET has a high saturation current.

In addition, in the embodiments of the present disclosure, by thinning semiconductor fins, more spaces are provided for forming semiconductor layers on the sidewalls of semiconductor fins. The required chip area occupied by the respective FinFET is hence reduced. The channel width of the respective FinFET, however, is not adversely reduced since the total width of the 2DEG channel is not reduced compared to the scenario that no thinning is performed.

In accordance with some embodiments, a device includes a substrate and insulation regions over a portion of the substrate. A first semiconductor region is between the insulation regions and having a first conduction band. A second semiconductor region is over and adjoining the first semiconductor region, wherein the second semiconductor region includes an upper portion higher than top surfaces of the insulation regions to form a semiconductor fin. The second semiconductor region also includes a wide portion and a narrow portion over the wide portion, wherein the narrow portion is narrower than the wide portion. The semiconductor fin has a tensile strain and has a second conduction band lower than the first conduction band. A third semiconductor region is over and adjoining a top surface and sidewalls of the semiconductor fin, wherein the third semiconductor region has a third conduction band higher than the second conduction band.

In accordance with other embodiments, a device includes a silicon substrate and STI regions over a portion of the silicon substrate. A first SiGe region is located between and in contact with the STI regions, wherein the first SiGe region has a first germanium atomic percentage. A silicon-containing region is over the first SiGe region. The silicon-containing region has a tensile stress. A second SiGe region contacts a top surface and sidewalls of the silicon-containing region. The silicon-containing region has a wide portion having a first sidewall and a top surface, and a narrow portion over the wide portion and having a second sidewall. The first sidewall and the second sidewall are on a same side of the silicon-containing region. Edges of the wide portion are vertically aligned to respective edges of the first SiGe region. The top surface of the wide portion connects the first sidewall to the second sidewall. The second SiGe region has second germanium atomic percentage. The first and the second germanium atomic percentages are higher than a third germanium atomic percentage of the silicon-containing region. The device further includes a gate dielectric over the second SiGe region, a gate electrode over the gate dielectric, and a source region and a drain region on opposite sides of the gate dielectric and the gate electrode.

In accordance with yet other embodiments, a method includes recessing a portion of a substrate between two insulation regions to form a recess, performing a first epitaxy to grow a first semiconductor region in the recess, and performing a second epitaxy to grow a second semiconductor region in the recess. The first semiconductor region is relaxed. The second semiconductor region is over and contacting the first semiconductor region. The second semiconductor region has a tensile strain. A planarization is performed to level top surfaces of the second semiconductor region and the insulation regions. The insulation regions are recessed, wherein a top portion of the second semiconductor region over the insulation regions forms a semiconductor fin. The semiconductor fin is thinned to have a smaller width. A third epitaxy is performed to grow a third semiconductor region on a top surface and sidewalls of the semiconductor fin. The second semiconductor region has a conduction band lower than conduction bands of the first and the third semiconductor regions.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
    a substrate;
    isolation regions over a portion of the substrate;
    a semiconductor region having a tensile strain, wherein the semiconductor region comprises:
        a wide portion having sidewalls contacting the isolation regions; and
        a narrow portion narrower than the wide portion, wherein the narrow portion is higher than top surfaces of the isolation regions to form a semiconductor fin;
    a gate stack comprising a gate dielectric, wherein the gate dielectric extends on a top surface and a sidewall of the semiconductor fin; and
    a source region and a drain region on opposite sides of the gate stack, wherein both the wide portion and the narrow portion extend from the source region to the drain region.

2. The device of claim 1 further comprising:
    a relaxed semiconductor region between the isolation regions and having a first conduction band, wherein the semiconductor fin has a second conduction band lower than the first conduction band.

3. The device of claim 1 further comprising a first semiconductor layer contacting the top surface and the sidewalls of the semiconductor fin, wherein the first semiconductor layer is substantially free from p-type and n-type impurities.

4. The device of claim 3 further comprising a second semiconductor layer over and contacting the first semiconductor layer, wherein the second semiconductor layer comprises an n-type impurity.

5. The device of claim 4 further comprising a third semiconductor layer over and contacting the second semiconductor layer, wherein the third semiconductor layer is substantially free from n-type impurities.

6. The device of claim 4, wherein both the first semiconductor layer and the second semiconductor layer comprise silicon and germanium, and the first semiconductor layer and the second semiconductor layer have substantially a same germanium percentage.

7. The device of claim 1 further comprising a silicon cap between the semiconductor fin and the gate stack, wherein the silicon cap is free from n-type impurities.

8. A device comprising:
    a silicon substrate;
    Shallow Trench Isolation (STI) regions extending into a portion of the silicon substrate;
    a silicon germanium region comprising:
        a wide portion having a first sidewall and a top surface, wherein the first sidewall contacts a sidewall of the STI regions; and
        a narrow portion over the wide portion and having a second sidewall, wherein the first sidewall and the second sidewall are on a same side of the silicon germanium region, and wherein the top surface of the wide portion connects the first sidewall to the second sidewall;
    a first silicon germanium layer on a top surface and sidewalls of the narrow portion;
    a second silicon germanium layer over and contacting the first silicon germanium layer, wherein the first and the second silicon germanium layers have higher germanium percentages than the silicon germanium region, and the second silicon germanium layer has an n-type impurity concentration higher than the first silicon germanium layer;
    a gate dielectric over the second silicon germanium layer; and
    a gate electrode over the gate dielectric.

9. The device of claim 8 further comprising a source region and a drain region on opposite ends of the silicon germanium region, wherein the source region and the drain region are doped with an n-type impurity, and the first silicon germanium layer is free from n-type impurities.

10. The device of claim 9, wherein the first silicon germanium layer is further free from p-type impurities.

11. The device of claim 8 further comprising a source region and a drain region on opposite sides of the gate dielectric and the gate electrode, wherein the second sidewall extends from the source region to the drain region.

12. The device of claim 8 further comprising a third silicon germanium layer over and contacting the second silicon germanium layer, wherein the third silicon germanium layer has a lower n-type impurity concentration than the second silicon germanium layer.

13. The device of claim 12, wherein the third silicon germanium layer is free from n-type impurities.

14. The device of claim 12, wherein the second silicon germanium layer has a conduction band lower than conduction bands of the first silicon germanium layer and the third silicon germanium layer.

15. A device comprising:
a silicon substrate;
Shallow Trench Isolation (STI) regions extending into a portion of the silicon substrate;
a first silicon germanium (SiGe) region located between and in contact with the STI regions, wherein the first SiGe region has a first germanium atomic percentage;
a second SiGe region over and in contact with the first SiGe region, wherein the second SiGe region has a second germanium atomic percentage higher than the first silicon germanium region;
a third SiGe region contacting a top surface and sidewalls of an upper portion of second SiGe region, wherein the third SiGe region comprises:
a first SiGe layer not doped with either of n-type and p-type impurities; and
a second SiGe layer doped with an n-type impurity over the first SiGe layer;
a gate dielectric over the third SiGe region;
a gate electrode over the gate dielectric; and
a source region and a drain region on opposite sides of the gate dielectric and the gate electrode.

16. The device of claim 15, wherein the second SiGe region extends from the source region to the drain region.

17. The device of claim 15, wherein the first SiGe layer is un-doped with n-type impurities.

18. The device of claim 17, wherein the first SiGe layer is further un-doped with p-type impurities.

19. The device of claim 17, wherein the third SiGe region further comprises a third SiGe layer over the second SiGe layer, wherein the third SiGe layer is free from n-type impurities.

20. The device of claim 19, further comprising a silicon cap over the third SiGe layer, wherein the silicon cap is neither doped with n-type impurities nor doped with p-type impurities.

* * * * *